(12) United States Patent
Giard et al.

(10) Patent No.: US 10,305,514 B2
(45) Date of Patent: May 28, 2019

(54) MULTI-MODE UNROLLED POLAR DECODERS

(71) Applicants: THE ROYAL INSTITUTION FOR THE ADVANCEMENT OF LEARNING/MCGILL UNIVERSITY, Montreal (CA); ECOLE DE TECHNOLOGIE SUPERIEURE, Montreal (CA)

(72) Inventors: Pascal Giard, Ste-Marthe-sur-le-Lac (CA); Gabi Sarkis, San Diego, CA (US); Warren Gross, Montreal (CA); Claude Thibeault, Brossard (CA)

(73) Assignee: THE ROYAL INSTITUTION FOR THE ADVANCEMENT OF LEARNING/MCGILL UNIVERSITY, Montreal (CA)

( * ) Notice: Subject to any disclaimer, the term of this patent is extended or adjusted under 35 U.S.C. 154(b) by 85 days.

(21) Appl. No.: 15/423,924

(22) Filed: Feb. 3, 2017

(65) Prior Publication Data

US 2017/0230059 A1 Aug. 10, 2017

Related U.S. Application Data

(60) Provisional application No. 62/291,081, filed on Feb. 4, 2016.

(51) Int. Cl.
*H03M 13/00* (2006.01)
*H03M 13/13* (2006.01)
(Continued)

(52) U.S. Cl.
CPC ..... *H03M 13/134* (2013.01); *H03M 13/2927* (2013.01); *H03M 13/6516* (2013.01); *H04L 1/0052* (2013.01)

(58) Field of Classification Search
CPC .......... H03M 13/134; H03M 13/6516; H03M 13/13; H03M 13/111; H03M 13/2927;
(Continued)

(56) References Cited

U.S. PATENT DOCUMENTS

| 2013/0117344 | A1* | 5/2013 | Gross | G06F 17/10 |
| | | | | 708/490 |
| 2015/0333775 | A1* | 11/2015 | Korb | H03M 13/45 |
| | | | | 714/780 |

(Continued)

OTHER PUBLICATIONS

E. Arıkan, "Channel polarization: A method for constructing capacity-achieving codes for symmetric binary-input memoryless channels," IEEE Trans. Inf. Theory, vol. 55, No. 7, pp. 3051-3073, 2009.

(Continued)

*Primary Examiner* — Christine T. Tu
(74) *Attorney, Agent, or Firm* — Norton Rose Fulbright Canada LLP

(57) ABSTRACT

There is described a multi-mode unrolled decoder. The decoder comprises a master code input configured to receive a polar encoded master code of length N carrying k information bits and N-k frozen bits, decoding resources comprising processing elements and memory elements connected in an unrolled architecture and defining an operation path between the master code input and an output, for decoding a polar encoded code word, at least one constituent code input configured to receive a polar encoded constituent code of length N/p carrying j information bits and N/p-j frozen bits, where p is a power of 2, and at least one input multiplexer provided in the operation path to selectively transmit N/p bits of one of the master code and the constituent code to a subset of the decoding resources.

17 Claims, 9 Drawing Sheets

(51) Int. Cl.
*H03M 13/29* (2006.01)
*H04L 1/00* (2006.01)
(58) Field of Classification Search
CPC ....... H04L 1/0052; H04L 1/009; G06F 17/10; G06F 17/11; G06F 17/16
See application file for complete search history.

(56) References Cited

U.S. PATENT DOCUMENTS

2015/0381208 A1* 12/2015 Li ................. H03M 13/13 714/755
2016/0164629 A1* 6/2016 Ahn ................. H04L 1/0041 714/776

OTHER PUBLICATIONS

E. Ankan, "Systematic polar coding," IEEE Commun. Lett., vol. 15, No. 8, pp. 860-862, 2011.
A. Alamdar-Yazdi and F. R. Kschischang, "A simplified successive-cancellation decoder for polar codes," IEEE Commun. Lett., vol. 15, No. 12, pp. 1378-1380, 2011.
C. Leroux, A. Raymond, G. Sarkis, and W. Gross, "A semi-parallel successive-cancellation decoder for polar codes," IEEE Trans. Signal Process., vol. 61, No. 2, pp. 289-299, Jan. 2013.
A. Mishra, A. Raymond, L. Amaru, G. Sarkis, C. Leroux, P. Meinerzhagen, A. Burg, and W. Gross, "A successive cancellation decoder asic for a 1024-bit polar code in 180nm cmos," in IEEE Asian Solid State Circuits Conf. (A-SSCC), Nov. 2012, pp. 205-208.
I. Tal and A. Vardy, "How to construct polar codes," IEEE Trans. Inf. Theory, vol. 59, No. 10, pp. 6562-6582, Oct. 2013.
A. Pamuk and E. Arikan, "A two phase successive cancellation decoder architecture for polar codes," in IEEE Int. Symp. on Inf. Theory Proc. (ISIT), Jul. 2013, pp. 957-961.
B. Yuan and K. Parhi, "Low-latency successive-cancellation polar decoder architectures using 2-bit decoding," IEEE Trans. Circuits Syst. I, vol. 61, No. 4, pp. 1241-1254, Apr. 2014.
P. Schläfer, N. Wehn, M. Alles, and T. Lehnigk-Emden, "A new dimension of parallelism in ultra high throughput LDPC decoding," in IEEE Workshop on Signal Process. Syst. (SiPS), 2013, pp. 153-158.

G. Sarkis, P. Giard, A. Vardy, C. Thibeault, and W. J. Gross, "Fast polar decoders: Algorithm and implementation," IEEE J. Sel. Areas Commun., vol. 32, No. 5, pp. 946-957, May 2014.
Y. S. Park, Y. Tao, S. Sun, and Z. Zhang, "A 4.68Gb/s belief propagation polar decoder with bit-splitting register file," in Symp. on VLSI Circuits Dig. of Tech. Papers, Jun. 2014, pp. 1-2.
A. Raymond and W. Gross, "A scalable successive-cancellation decoder for polar codes," IEEE Trans. Signal Process., vol. 62, No. 20, pp. 5339-5347, Oct. 2014.
B. Li, H. Shen, D. Tse, and W. Tong, "Low-latency polar codes via hybrid decoding," in Int. Symp. on Turbo Codes and Iterative Inf. Process. (ISTC), Aug. 2014, pp. 223-227.
Y. Li, H. Alhussien, E. Haratsch, and A. Jiang, "A study of polar codes for MLC NAND flash memories," in Int. Conf. on Comput., Netw. and Commun. (ICNC), Feb. 2015, pp. 608-612.
P. Giard, G. Sarkis, C. Thibeault, and W. J. Gross, "237 Gbit/s unrolled hardware polar decoder," IET Electron. Lett., vol. 51, No. 10, pp. 762-763, 2015.
O. Dizdar and E. Ankan, "A high-throughput energy-efficient implementation of successive-cancellation decoder for polar codes using combinational logic," IEEE Trans. Circuits Syst. I, vol. 63, No. 3, pp. 436-447, Mar. 2016.
C. Xiong, J. Lin, and Z. Yan, "A multimode area-efficient SCL polar decoder," IEEE Trans. VLSI Syst., vol. 24, No. 12, pp. 3499-3512, 2016.
G. Sarkis, I. Tal, P. Giard, A. Vardy, C. Thibeault, and W. J. Gross, "Flexible and low-complexity encoding and decoding of systematic polar codes," IEEE Trans. Commun., vol. 64, No. 7, pp. 2732-2745, 2016.
P. Giard, A. Balatsoukas-Stimming, G. Sarkis, C. Thibeault, and W. J. Gross, "Fast low-complexity decoders for low-rate polar codes," J Sign Process Syst., 2016. [Online]. Available: http://arxiv.org/abs/1603.05273.
N. Wehn, S. Scholl, P. Schläfer, T. Lehnigk-Emden, and M. Alles, "Challenges and limitations for very high throughput decoder architectures for soft-decoding," in Advanced Hardware Design for Error Correcting Codes, C. Chavet and P. Coussy, Eds. Springer International Publishing, 2015, pp. 7-31.
C. Leroux, A. J. Raymond, G. Sarkis, I. Tal, A. Vardy, and W. J. Gross, "Hardware implementation of successive-cancellation decoders for polar codes," J. Signal Process. Syst., vol. 69, No. 3, pp. 1-9, 2012.

* cited by examiner

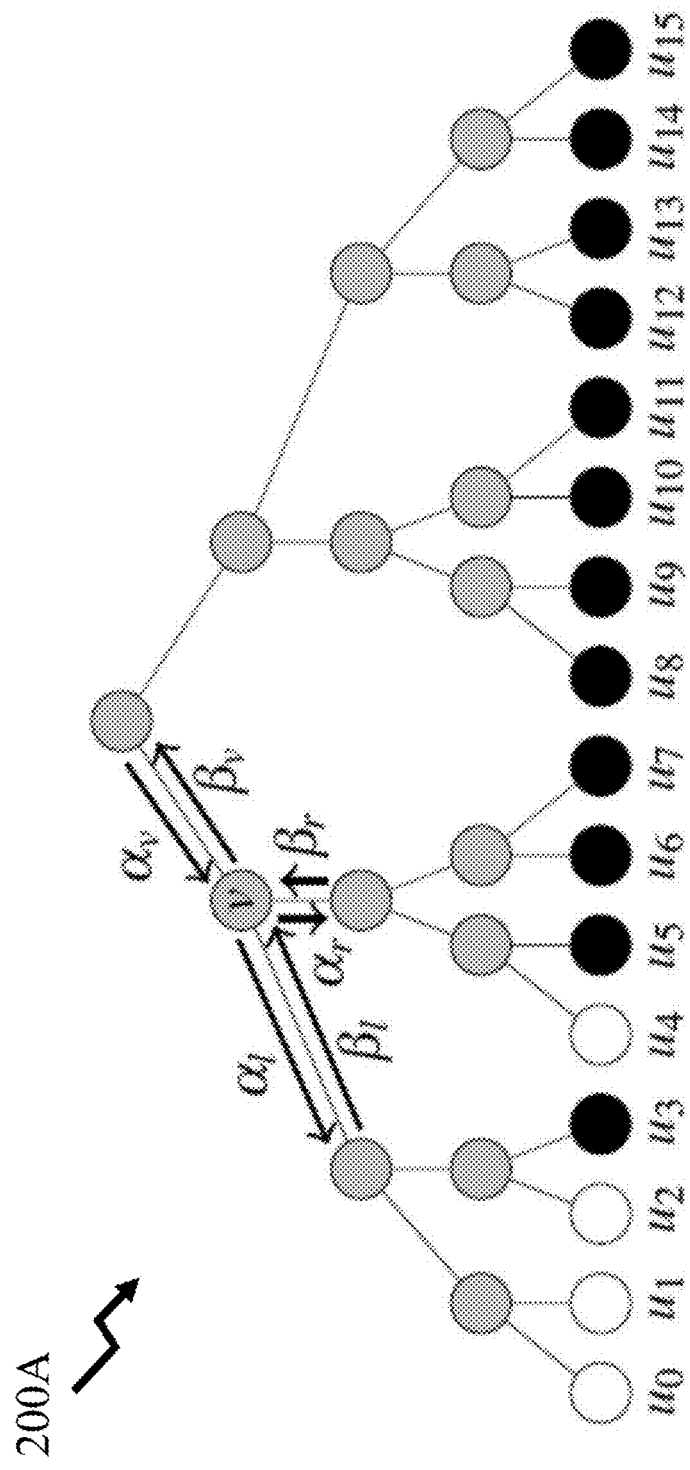

MULTI-MODE UNROLLED POLAR DECODERS

CROSS-REFERENCE TO RELATED APPLICATIONS

The present application claims the benefit of U.S. Provisional Patent Application No. 62/291,081 filed on Feb. 4, 2016, the contents of which are hereby incorporated by reference in their entirety.

FIELD OF THE INVENTION

The present disclosure relates to polar codes and more specifically to fully-unrolled polar code decoders supporting multiple polar codes of various lengths and data rates.

BACKGROUND OF THE ART

Two recurring central topics in information theory are efficient compression and reliable transmission of data. In the last 20 years or so communications and information technologies have fundamentally changed how we access information, interact as a society, and communicate. Today, these central topics are everywhere in our daily lives whether they arise in our use of portable electronic devices for mobile communications, multimedia streaming/downloading, Internet access, etc. or fixed electronic devices for content acquisition, watching our favorite television show, storing family photos, etc. Further, the ubiquitous nature of computing devices, cloud based storage, and the enhanced speed performance of the Internet mean that increasing our lives exploits remote stores of data.

To make communications reliable in the presence of noise, redundancy in the data is added before transmission as the intended receiver only has access to a noisy version of the data. If the redundancy is added through coding, then it is possible to reconstruct the original data at the receiver in the presence of noise through decision making processes at the receiver. Coding is therefore a central and essential element in any communication system. However, adding this redundancy comes at the cost of reducing the effective rate of data transmission since, in addition to the data, we must also transmit the redundant data.

Within this context polar codes have gathered significant attention as they are error-correcting codes with an explicit construction that provably achieve the symmetric capacity of memoryless channels. A (N, k) polar code is of length N and carries k information bits and is thus of rate $R=k/N$. Polar codes are built recursively such that a polar code of length N is the concatenation of two polar codes of length N/2. These can be decoded by using a low-complexity decoding algorithm, known as successive cancellation (SC). However, as this proceeds bit-by-bit, hardware implementations suffer from low throughput and high latency. To overcome this, modified SC-based algorithms were proposed and hardware implementations with a throughput greater than 1 Gbps have been demonstrated. Unrolled hardware architectures for polar decoders have been proposed and results showed a very high throughput, greater than 1 Tbps. However, these architectures are built for a fixed polar code i.e. the code length or rate cannot be modified at execution time. This represents a significant drawback for most modern wireless communication applications that largely benefit from the support of multiple code lengths and rates.

Therefore, there is a need for improvement.

SUMMARY

There is described herewith methods and systems for fully-unrolled polar code decoders supporting multiple polar code lengths and data rates.

In accordance with a first broad aspect, there is provided a decoder for polar encoded code words. The decoder comprises a master code input configured to receive a polar encoded master code of length N carrying k information bits and N−k frozen bits, decoding resources comprising processing elements and memory elements connected in an unrolled architecture and defining an operation path between the master code input and an output, for decoding a polar encoded code word, at least one constituent code input configured to receive a polar encoded constituent code of length N/p carrying j information bits and N/p−j frozen bits, where p is a power of 2, and at least one multiplexer provided in the operation path to selectively transmit N/p bits of one of the master code and the constituent code to a subset of the decoding resources.

In some embodiments, the decoder further comprises at least one output multiplexer provided in the operation path downstream from the at least one input multiplexer to selectively transmit an estimated code word corresponding to the N/p bits of one of the master code and the constituent code towards the output.

In accordance with another broad aspect, there is provided a method for decoding polar encoded codes using an unrolled polar code decoder. The method comprises receiving, at a first intermediate node of an operation path defined between an input and an output of an unrolled decoder formed of decoding resources for decoding a master code of length N, a first polar encoded constituent code of length N/p, where p is a power of 2, transmitting the first polar encoded constituent code to a first subset of the decoding resources though a first input multiplexer, estimating a first code word for the first polar encoded constituent code through the first subset of decoding resources, and outputting, at the output, the estimated first code word corresponding to the first polar encoded constituent code.

In some embodiments, the method further comprises transmitting the estimated first code word towards the output through an output multiplexer.

Other aspects and features will become apparent to those ordinarily skilled in the art upon review of the following description of specific embodiments in conjunction with the accompanying figures.

BRIEF DESCRIPTION OF THE DRAWINGS

Further features of the present disclosure will become apparent from the following detailed description, taken in combination with the appended drawings, in which:

FIGS. 2A-2B depict decoder trees for a successive-cancellation (SC) and fast-simplified-successive-cancellation (Fast-SSC) decoders for an example (16,12) polar code;

It will be noted that throughout the appended drawings, like features are identified by like reference numerals.

DETAILED DESCRIPTION

The present disclosure is directed to polar codes and more specifically to fully-unrolled polar code decoders supporting multiple polar code lengths and data rates, referred to herein as a multi-mode unrolled decoder.

An (N, k) polar code has length N, carries k information bits and is of rate R=k/N. The other N−k bits, so called frozen bits, are set to a predetermined value, usually zero but possibly another value, during the encoding process. Non-systematic polar encoding can be represented as $x=uF_N$ where u is a row vector containing both information and frozen bits, and $F_N$ is a generator matrix. This $F_N$ can be defined recursively so that $F_N = F_2^{\otimes \log_2 N}$, where $$F_2 = \begin{bmatrix} 1 & 0 \\ 1 & 1 \end{bmatrix}$$

and $\otimes$ is the Kronecker product. Determining the optimal locations for the information bits depends on the channel type and condition.

Encoding schemes for polar codes can be either non-systematic or systematic. Systematic polar codes offer better bit-error-rate (BER) than their non-systematic counterparts, while maintaining the same frame-error-rate (FER). The multi-mode unrolled decoder supports systematic and non-systematic codes. Both encoding types use $F_N$ and as $F_N$ is built recursively, so are polar codes i.e. a code of length N is the concatenation of two codes of length N/2.

Figure 1:
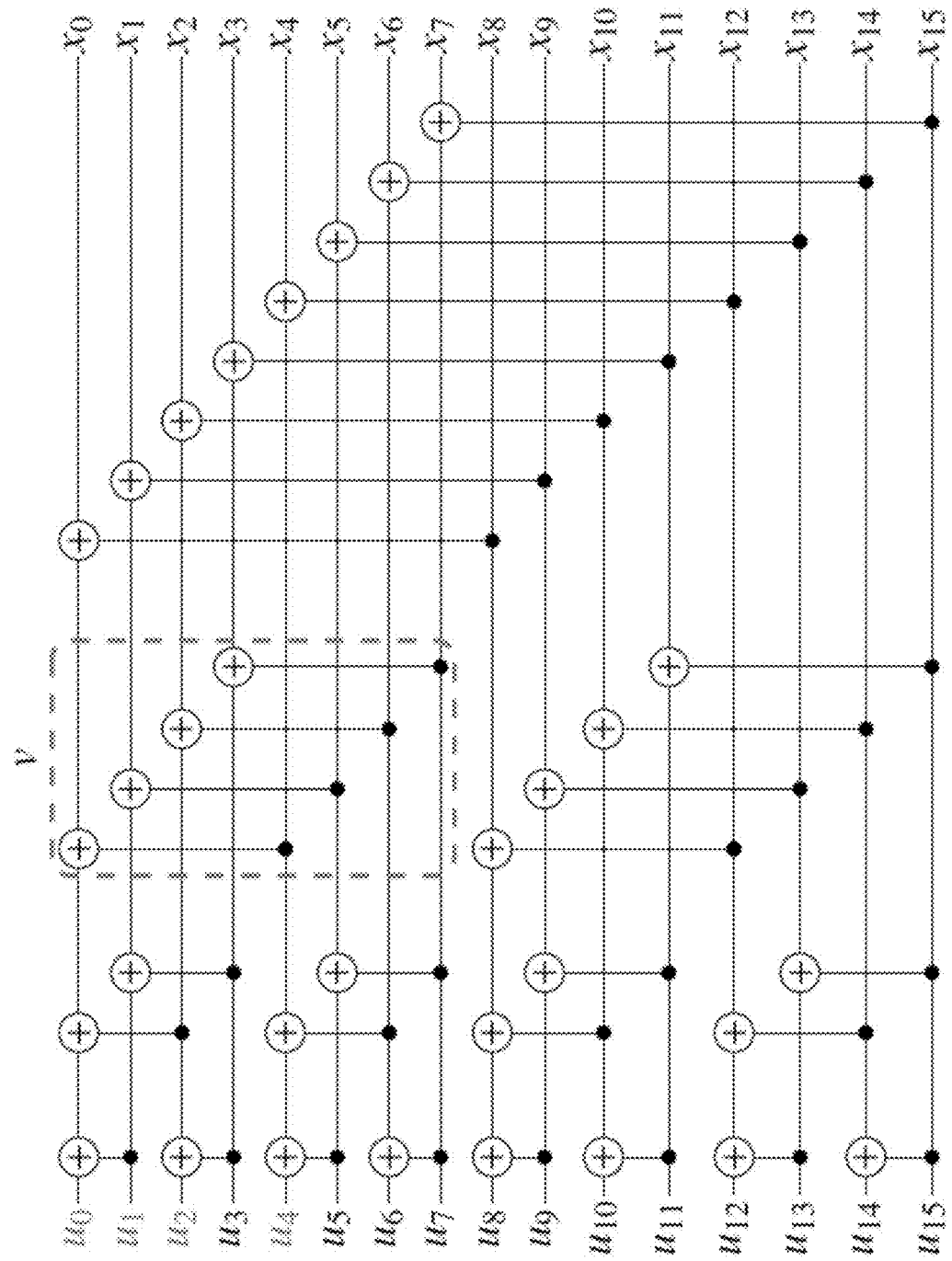
FIG. 1 depicts a graph representation of an example (16, 12) polar code.

Referring to FIG. 1 there is depicted a graph representation of a (16, 12) polar code. The encoding process goes from left to right and decoding from right to left. The grayed $u_i$, 0≤i<N, correspond to frozen bit locations. The dashed region, v, represents a concatenation of two codes of length 4, a (4, 1) polar code with a (4, 3) one, yielding an (8,4) polar code.

Polar codes can also be represented as decoder trees, such as depicted in FIG. 2a at 200A, which is the decoder tree equivalent to the graph of FIG. 1. Black and white nodes are information and frozen bits, respectively. The left-hand-side (LHS) and right-hand-side (RHS) subtrees rooted in the top node are polar codes of length N/2. We designate herein the polar code of length N decoded by traversing the whole decoder tree as the master code and the various codes of lengths smaller than N as constituent codes.

By definition, and like the master code, a constituent code of length N/2 is in turn the concatenation of two polar codes of length N/4, and so on until the leaf nodes are reached. As such, the decoding of a polar code of length N can be seen as the decoding of two constituent codes of length N/2, or of four constituent codes of length N/4, etc. For example, and as shown in the graph representation of FIG. 1, but better seen in the decoder tree 200a representation of FIG. 2a, a master code of length 16 is the concatenation of two constituent codes of length 8, or of four constituent codes of length 4, or of eight constituent codes of length 2.

It should be noted that sibling constituent codes with a same parent node share a special relationship. Let us consider the polar code (constituent code) of length N=8 taking root in v as illustrated in FIG. 2a, as the concatenation of two constituent codes of length N=4. As that polar code gets decoded, the estimated bits $\beta_l$ from its LHS constituent code are required to decode its RHS constituent code. Furthermore, once the estimated bits $\beta_r$ are obtained by decoding the RHS constituent code, they are combined with $\beta_l$ to form the final estimated code word $\beta_v$ for v.

Going down a left edge of each tree/sub-tree within the SC decoder tree 200a, $\alpha_l$ is calculated with the min-sum approximation given by Equation (1) for $$0 \le i < \frac{N_v}{2},$$

where $\alpha_v$ is the input to the node and $N_v$ the width of $\alpha_v$. Now traversing the right edge of each tree/sub-tree within the SC decoder tree 200a, $\alpha_r$ is calculated using Equation (2) for $$0 \le i < \frac{N_v}{2},$$

where $\beta_l$ is the bit estimate from the LHS child.

$$\alpha_l[i] = \text{sgn}(\alpha_v[i] \cdot \alpha_v[i+N_v/2]) \min(|\alpha_v[i]|, |\alpha_v[i+N_v/2]|) \quad (1)$$

$$\alpha_r[i] = \begin{cases} \alpha_v[i+N_v/2] + \alpha_v[i] & \text{when } \beta_l[i] = 0 \\ \alpha_v[i+N_v/2] - \alpha_v[i] & \text{otherwise} \end{cases} \quad (2)$$

Once a leaf node is reached, the bit estimate is set to zero when it corresponds to a frozen bit location. Otherwise, it is calculated by threshold detection on $\alpha_v$. Going back up a RHS edge the bit estimates from both children are combined to generate the node's bit-estimate vector $\beta_v[i]$ as given by Equation (3), where $\oplus$ is the modulo-2 addition (XOR).

$$\beta_v[i] = \begin{cases} \beta_l[i] \oplus \beta_r[i] & \text{when } i < N_v/2 \\ \beta_r[i - N_v/2] & \text{otherwise} \end{cases} \quad (3)$$

In a Simplified SC (SSC) algorithm, decoder tree nodes are split into three categories: Rate-0, Rate-1, and Rate-R nodes. Rate-0 nodes are subtrees whose leaf nodes all correspond to frozen bits. We do not need to use a decoding algorithm on such a subtree as the exact decision, by definition, is always the all-zero vector. Rate-1 nodes are subtrees where all leaf nodes carry information bits, none are frozen. The maximum-likelihood decoding rule for these nodes is to take a hard decision on input log-likelihood ratios (LLRs):

$$\beta_v[i] = \begin{cases} 0 & \text{when } \alpha_v[i] \geq 0; \\ 1 & \text{otherwise} \end{cases} \quad (4)$$

for $0 \leq i < N_v$. With a fixed-point representation, this operation amounts to copying the most significant bit of the input LLRs.

Rate-R nodes, where $0<R<1$, are subtrees such that leaf nodes are a mix of information and frozen bits. Instead of always using the SC or SSC algorithm, some Rate-R nodes corresponding to specific frozen-bit locations can be decoded using algorithms with lower complexity and latency.

The F and G operations are among the functions used in the conventional SC decoding algorithm and are calculated using (1) and (2), respectively. G0R is a special case of the G operation where the left child is a frozen node i.e. $\beta_l$ is known a priori to be the all-zero vector of length $N_v/2$.

As defined by equation (3), the Combine operation generates the bit estimate vector. A C0R operation is a special case of the Combine operation where the LHS constituent code, $\beta_l$, is a Rate-0 node.

In a Repetition node, all leaf nodes are frozen bits, with the exception of the node that corresponds to the most RHS leaf in a tree. At encoding time, the only information bit gets repeated over the $N_v$ outputs. The information bit can be estimated by using threshold detection over the sum of the input LLRs $\alpha_v$:

$$\beta_v = \begin{cases} 0 & \text{when } \left(\sum_{i=0}^{N_v-1} \alpha_v[i]\right) \geq 0; \\ 1 & \text{otherwise} \end{cases}$$

Where $\beta_v$ gets replicated $N_v$ times to create the bit-estimate vector.

A single-parity-check (SPC) node is a node such that all leaf nodes are information bits with the exception of the node at the least significant position (LHS leaf in a tree). To decode an SPC code, we start by calculating the parity of the input LLRs:

$$\text{parity} = \bigoplus_{i=0}^{N_v-1} \beta_v[i] \text{ where } \beta_v = \begin{cases} 0 & \text{when } (\alpha_v[i]) \geq 0; \\ 1 & \text{otherwise} \end{cases}$$

The estimated bit vector is then generated by reusing the calculated $\beta_v$ above unless the parity constraint is not satisfied, i.e. is different than zero. In that case, the estimated bit corresponding to the input with the smallest LLR magnitude is flipped:

$$\beta_v[i] = \beta_v[i] \oplus 1, \text{ where } i = \arg\min(|\alpha_v[j]|)$$

Figure 2B:
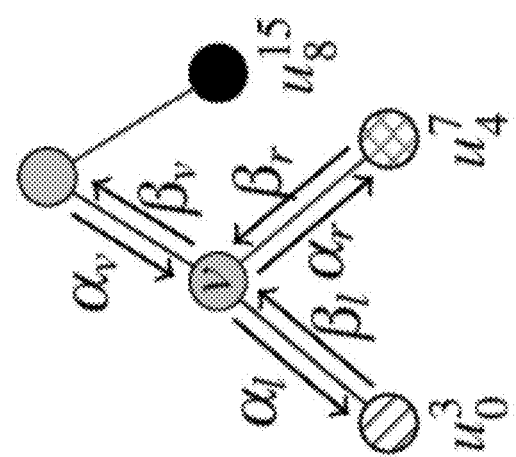

FIG. 2b shows a decoder tree 200b equivalent to the decoder tree 200a of FIG. 2a when a Fast Simplified Successive-Cancellation (FAST-SSC) decoding algorithm is used. The black nodes represent a rate-1 constituent code i.e. a polar code entirely composed of information bits. The striped and cross-hatched nodes are repetition and single-parity check (SPC) constituent codes, respectively. Gray nodes are codes of rate $0<R<1$. It can be seen that Fast-SSC visits few nodes in the decoder tree, significantly decreasing the latency and increasing the throughput. It provides the exact same code word estimates as the SC algorithm though, hence it offers the same error-correction performance.

The multi-mode unrolled decoder borrows from the Fast-SCC algorithm in that it uses specialized nodes and operations described above to reduce the decoding latency. However, the family of architectures used differ from those known from Fast-SCC decoders.

In an unrolled decoder, each and every operation required is instantiated so that data can flow through the decoder with minimal control. A dedicated unrolled decoder is only applicable to an (N, k) polar code of length N that carries k information bits and is of rate R=k/N. The multi-mode unrolled decoder can be used to decode polar encoded code words of length N as well as polar encoded code words of length<N. The multi-mode unrolled decoder comprises decoding resources, such as processing elements and memory elements, which are connected together in an unrolled architecture. The decoding resources define an operation path between an input, referred to as a master code input, and an output. The master code input is configured to receive a polar encoded master code of length N carrying k information bits and N−k frozen bits. The multi-mode unrolled decoder comprises at least one constituent code input configured to receive a polar encoded constituent code of length N/p carrying j information bits and N/p−j frozen bits, where p is a power of 2. The multi-mode unrolled decoder comprises at least one input multiplexer provided in the operation path to selectively transmit N/p bits of the master code or the constituent code to a subset of the decoding resources.

Figure 3:
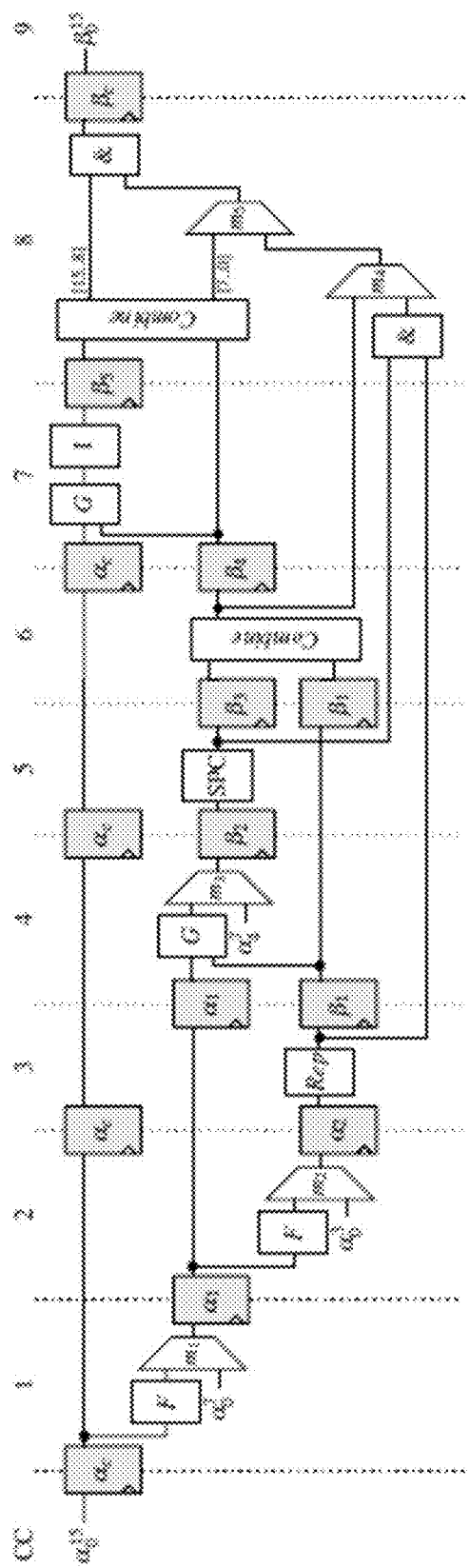
FIG. 3 depicts an example unrolled partially-pipelined decoder for a (16, 12) polar code with an initiation interval I=2.

FIG. 3 depicts an example embodiment of a multi-mode unrolled decoder, based on a fully-unrolled partially-pipelined decoder with an initiation interval I=2 for the (16,12) polar code of FIG. 2b. The initiation interval can be seen as the minimum number of clock cycles between two code word estimates. Some control and routing logic was added to make it multi-mode. The $\alpha$ and $\beta$ blocks as illustrated are registers holding log-likelihood ratios (LLRs) or bit estimates, respectively, i.e. they are the memory elements. The unfilled or white blocks are functions, with the exception of the "&" blocks that are bit-vector joining operators, i.e. they are the processing elements.

An unrolled decoder for a polar code of length N is composed of a subset of decoding resources for two polar codes of length N/2, which are each composed of a subset of decoding resources for two polar codes of length N/4, and so on. Thus, control and routing logic is provided in order to directly feed and read from the subset of decoding resources for constituent codes of length smaller than N. The end result is a multi-mode decoder supporting frames of various lengths and code rates.

In some embodiments, at least one output multiplexer is provided in the operation path downstream from the at least one input multiplexer. The output multiplexer selectively transmits an estimated code word corresponding to the N/p bits of the master code or the constituent code towards the output. While the output multiplexer is not strictly required, not having it would increase both time complexity and decoder operation complexity. In some embodiments, two or more constituent codes may share an output multiplexer. For example, this may be done when at least two constituent codes of the same length are used.

Consider the decoder tree 200b shown FIG. 2b along with its unrolled multi-mode implementation as illustrated in FIG. 3. In FIG. 2b, the constituent code taking root in v is an (8,4) polar code. Its corresponding decoder can be directly employed by placing the 8 channels LLRs into constituent code input $\alpha_0^7$ and by selecting the bottom input of the input multiplexer $m_1$ illustrated in FIG. 3. Its estimated code word is retrieved from reading the output of the Combine block feeding the $\beta_4$ register, i.e. by selecting the top and bottom inputs from output multiplexers $m_4$ and $m_5$, respectively, and by reading the 8 least-significant bits from $\beta_0^{15}$. Similarly, still in FIG. 3, the constituent code inputs $\alpha_0^3$, $\alpha_4^7$ can be fed via the input multiplexers $m_2$, $m_3$ respectively, and their output eventually recovered from the output of the Rep and SPC blocks, respectively.

Although not illustrated in FIG. 3, in some embodiments the unrolled multi-mode decoder comprises a controller configured to accommodate the use of multiple polar codes. In some embodiments, two look-up tables (LUTs) are provided. One LUT stores the decoding latency, in clock cycles, of each code. It serves as a stopping criteria to generate the done signal. The other LUT stores the clock cycle "value" $i_{start}$ at which the enable-signal generator circuit should start. Each non-master code may start at a value $(i_{start} \bmod I) \neq 0$. The controller may also generate the multiplexer select signals, allowing proper data routing, based on the selected mode.

Figure 4:
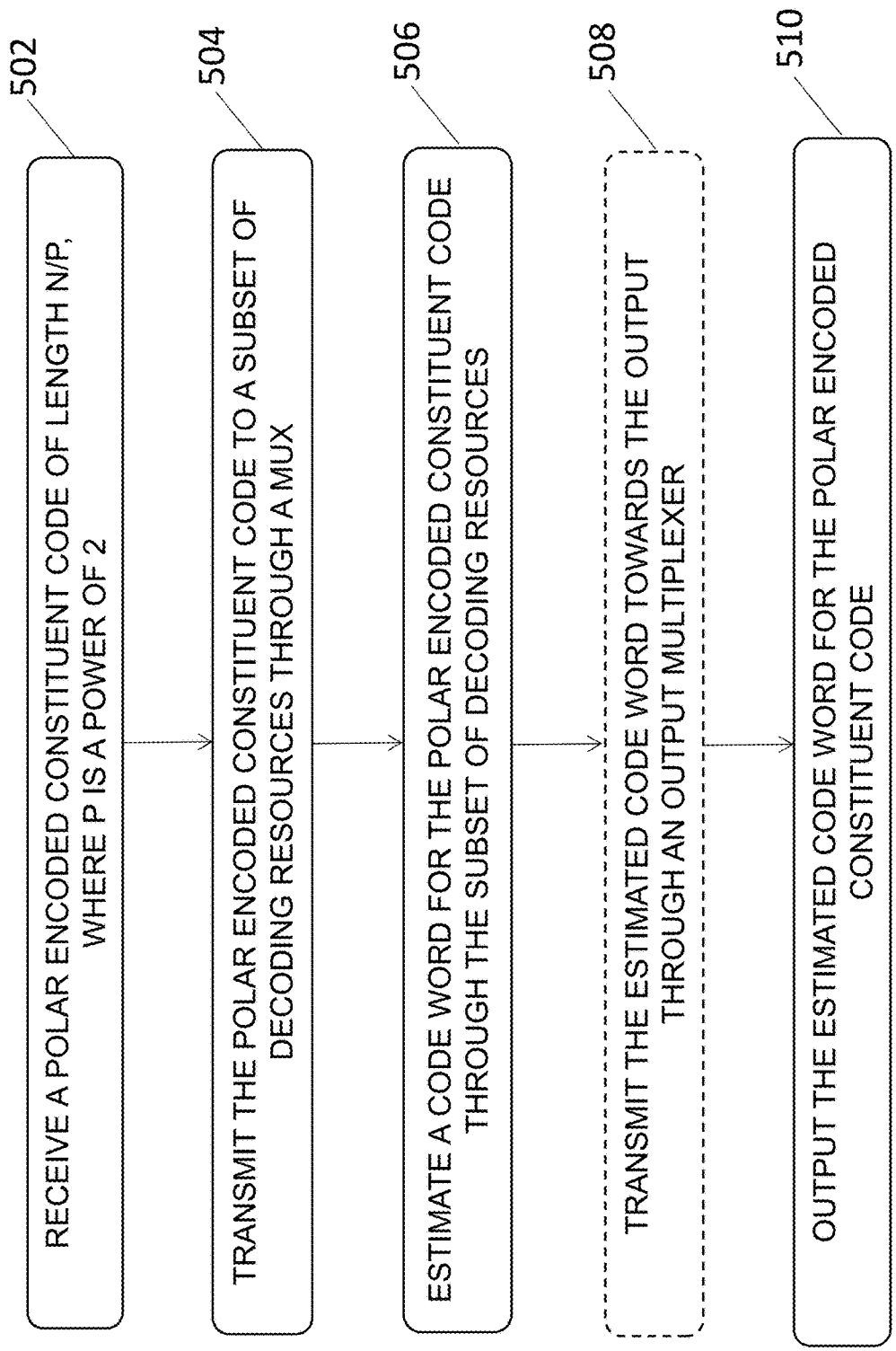
FIG. 4 is a flowchart of an example method for decoding polar encoded code words of length <N using an unrolled polar code decoder for polar codes of length N.

Referring to FIG. 4, there is illustrated an example method for decoding polar encoded code words using an unrolled multi-mode polar code decoder such as the one illustrated at FIG. 3. At 502, a polar encoded constituent code of length N/p is received at an intermediate node of the operation path defined between the master code input and the output of the multi-mode unrolled decoder. In the example of FIG. 3, the intermediate node corresponds to the input of one of the input multiplexers. Alternatively, another input node may be provided through one or more other component and the constituent code may then be transmitted towards an input multiplexer.

At 504, the constituent code is transmitted to a subset of the decoding resources through an input multiplexer, for example $m_1$, $m_2$, or $m_3$. At 506, the data provided to the input multiplexer travels through the various memory and processing elements of the subset of the decoding resources to produce an estimated code word. Optionally at 508, the estimated code word is transmitted towards the output through an output multiplexer. At 510, the estimated code word for the constituent code is output from the multi-mode unrolled decoder.

In some embodiments, the method comprises performing the steps for a first constituent code and performing the steps for a second constituent code, for example using two different multiplexers such as $m_1$ and $m_2$. The constituent codes may be input on a same or different clock cycles. Alternatively, or in combination therewith, the two constituent codes may be input in the same multiplexer, on subsequent clock cycles. The clock cycles may be consecutive or spaced apart. The two constituent codes may be of a same or different length, and they may transmitted towards the output using a same or different output multiplexer.

It will be understood that the method may be used to decode polar codes of length N as well as any number of polar codes of length N/p, where p is a power of 2, provided the suitable input and control logic is present in the multi-mode unrolled decoder. For example, when applied to the embodiment of FIG. 3, the method may be used to decode polar codes of length N=16 via input node $\alpha_0^{15}$, 16/2=8 via input node $\alpha_0^7$, and 16/4=4 via input nodes $\alpha_0^3$ and $\alpha_4^7$. The master codes and various constituent codes may be decoded concurrently or sequentially, using appropriate control logic.

Note that the SC-based multi-mode unrolled decoder may also be applied to a list-based decoder. In a list-based multi-mode unrolled decoder, a decoder for a polar code smaller than the master code is part of a larger decoder used to accommodate for a list size of L. Routing and control logic may therefore also be added to the list-based decoder in order to allow for decoding of code words smaller than length N.

In some embodiments, a master code may be assembled using two optimized constituent codes in order to increase the number of optimized polar codes available. Doing so, the number of information bits, or the code rate, of the second largest supported codes can be selected. As an example, a master code of length 2048 is constructed by concatenating two constituent codes of length 1024. The LHS and RHS constituent codes are chosen to have a rate of 1/2 and of 5/6, respectively. As a result, the assembled master code has rate of 2/3. The location of the frozen bits in the master code is dictated by its constituent codes. Note that the constituent code with the lowest rate is put on the left, and the one with the highest rate on the right, in order to minimize the coding loss associated with a non-optimized polar code.

Figure 5:
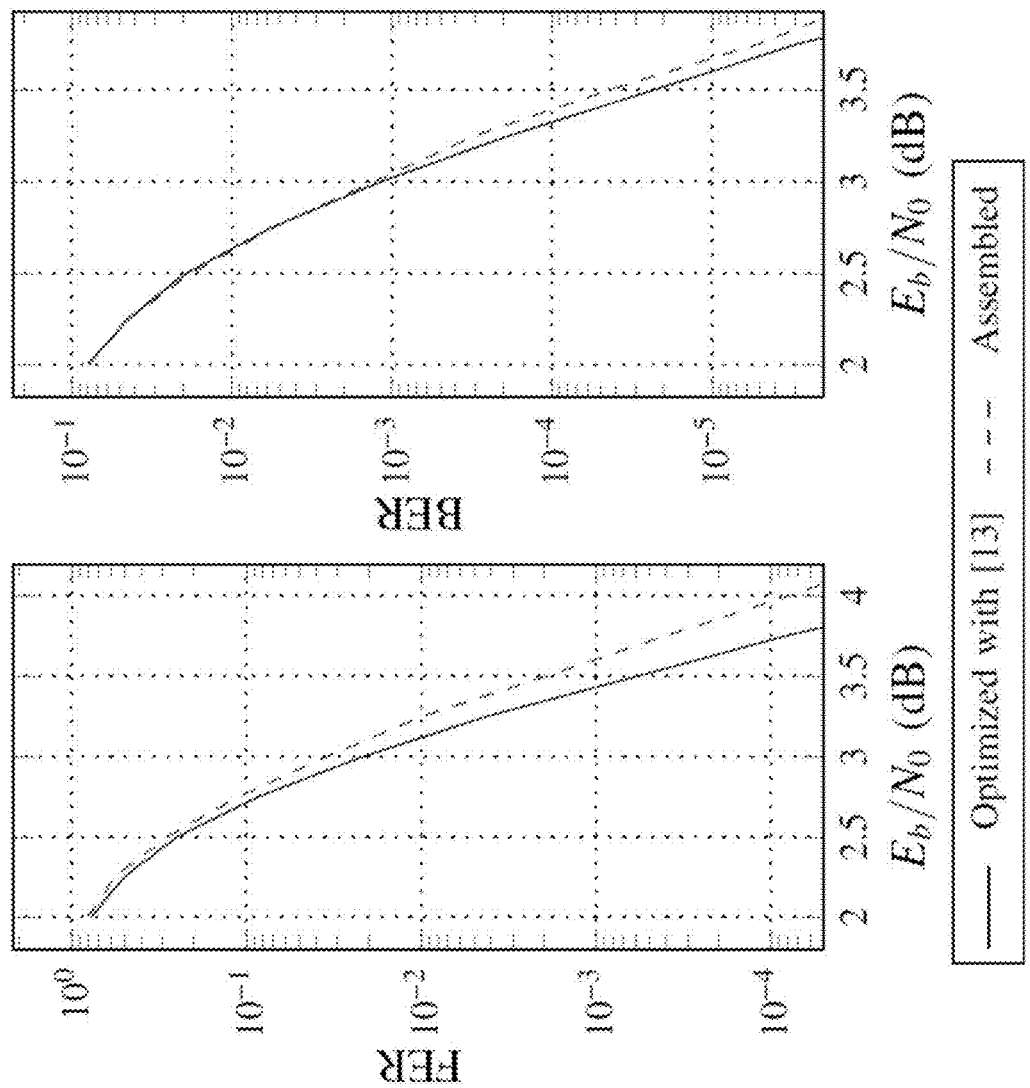
FIG. 5 depicts an example of the error-correction performance of two (2048, 1365) polar codes with different constructions.

FIG. 5 shows both the frame-error rate (left) and the bit-error rate (right) of two different (2048, 1365) polar codes. The black-solid curve is the performance of a polar code constructed using a prior art method for $E_b/N_0$=4 dB. The dashed curve is for the (2048, 1365) constructed by concatenating (assembling) a (1024, 512) polar code and a (1024, 853) polar code. Both polar codes of length 1024 were also constructed using the prior art method for $E_b/N_0$ values of 2.5 and 5 dB, respectively.

From FIG. 5, it can be seen that constructing an optimized polar code of length 2048 with rate of 2/3 results in a coding gain of approximately 0.17 dB at a FER of $10^{-3}$, an FER appropriate for certain applications, over one assembled from two shorter polar codes of length 1024. The gap is increasing with the signal-to-noise ratio, reaching 0.24 dB at an FER of $10^{-4}$. Looking at the BER curves, it can be observed that the gap is much narrower. Compared to that of the assembled master code, the optimized polar code shows a coding gain of 0.07 dB at a BER of $10^{-5}$.

The location of the frozen bits in non-optimized constituent codes is dictated by their parent code, i.e. the master code (polar code) of length N. In other words, if the master code of length N has been assembled from two optimized (constituent) polar codes of length N/2, the shorter optimized codes of length N/2 determine the location of the frozen bits in their respective constituent codes of length<N/2. Otherwise, the master code dictates the frozen bit locations for all constituent codes.

Assuming that the decoding algorithm takes advantage of the a priori knowledge of these locations, the code rate and frozen bit locations of the constituent codes cannot be changed at execution time. However, there are many constituent codes to choose from and code shortening can be used to create more, e.g. in order to obtain a specific number of information bits or code rate.

Because of the polarization phenomenon, given any two sibling constituent codes, the code rate of the LHS is always lower than that of the RHS for a properly constructed polar code. That property can be beneficially exploited as, in many wireless applications, it is desirable to offer a variety of codes of both high and low rates. It should be noted that not all constituent codes within a master code are of practical use e.g. codes of very high rate offer negligible coding gain over an uncoded communication. For example, among the four constituent codes of length 4 included in the (16,12) polar code illustrated in FIG. 2a, two of them are rate-1 constituent codes. Using them would be equivalent to uncoded communication. Moreover, among constituent codes of the same length, many codes may have a similar number of information bits with little to no error-correction performance difference in the region of interest. Therefore, in some embodiments, the master code is composed of q constituent codes but only m input multiplexers (where m<q) are provided in the architecture of the multi-mode unrolled decoder.

Figure 6:
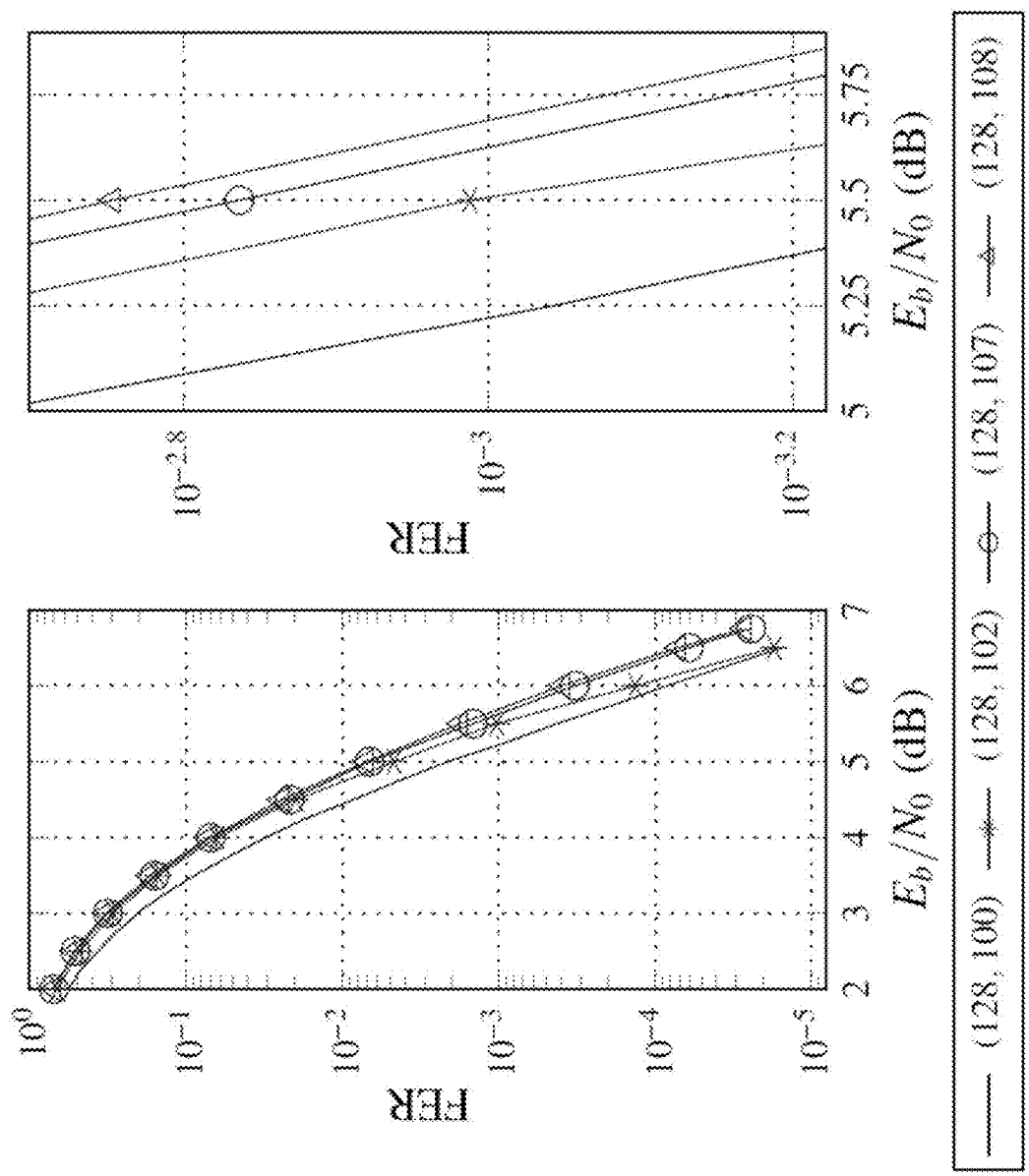
FIG. 6 depicts an example of the error-correction performance of four constituent codes of length 128 with a rate of approximately 5/6 contained within a proposed (2048, 1365) master code according.

FIG. 6 shows the frame-error rate of all four constituent codes of length 128 with a rate of approximately 5/6 that are contained within the proposed (2048, 1365) master code. It can be seen that, even at such a short length, at an FER of $10^{-3}$ the gap between both extremes is under 0.5 dB. It is generally beneficial to limit the number of codes supported in a practical implementation of a multi-mode unrolled decoder in order to minimize routing circuitry.

If a decoding algorithm taking advantage of the a priori knowledge of the frozen bit locations is used in the unrolled decoder, such as Fast-SSC, the latency will vary even among constituent codes of the same length. However, the coded throughput will not. The coded throughput of a polar code of length N will be double that of a constituent code of N/2, which in turn, is double that of a constituent code of length N/4, and so on.

In an unrolled decoder, the throughput is defined by the code length $N_v$, the clock frequency in Hz f and the initiation interval I. The coded and information throughput are given by Equations (4) and (5) respectively. For a master code $N_v = N$.

$$\tau_C = \frac{N_v \cdot f}{I} \quad (4)$$

$$\tau_I = \frac{R \cdot N_v \cdot f}{I} \quad (5)$$

In wireless communication standards where multiple codes lengths and rates are supported, the peak information throughput may be achieved with the longest code that has both the greatest latency and highest code rate. Another possible scenario is to use a low-rate master code, e.g. R=1/3, that is more powerful in terms of error-correction performance. The resulting multi-mode unrolled decoder would reach its peak information throughput with the longest constituent code of length N/2 that has the highest code rate, a code with a significantly lower decoding latency than that of the master code.

Results for two implementations of the multi-mode unrolled decoder are presented below. These examples are built around (1024, 853) and (2048, 1365) master codes. In the following, the former is referred to as the decoder supporting a maximum code length $N_{MAX}=1024$ and the latter as the decoder with $N_{MAX}=2048$. A total of ten polar codes were selected for the decoder supporting codes of lengths up to 2048. The other decoder with $N_{MAX}=1024$ has eight modes corresponding to a subset of the ten polar codes supported by the bigger decoder.

For the decoder with $N_{MAX}=1024$, the Repetition and SPC nodes were constrained to a maximum size $N_v$ of 8 and 4 respectively. For the decoder with $N_{MAX}=2048$ it was found to be more beneficial to lower the execution frequency and increase the maximum sizes of the Repetition and SPC nodes to 16 and 8, respectively. Additionally, the decoder with $N_{MAX}=2048$ also uses RepSPC nodes to reduce latency.

In the examples, the multi-mode unrolled decoders are built with sufficient memory to accommodate storing an extra frame at the input, and to preserve an estimated code word at the output. As a result, the next frame can be loaded while a frame is being decoded. Similarly, an estimated code word can be read while the next frame is being decoded. We define decoding latency to include the time required to load channel LLRs, decode a frame and offload the estimated code word.

Figure 7:
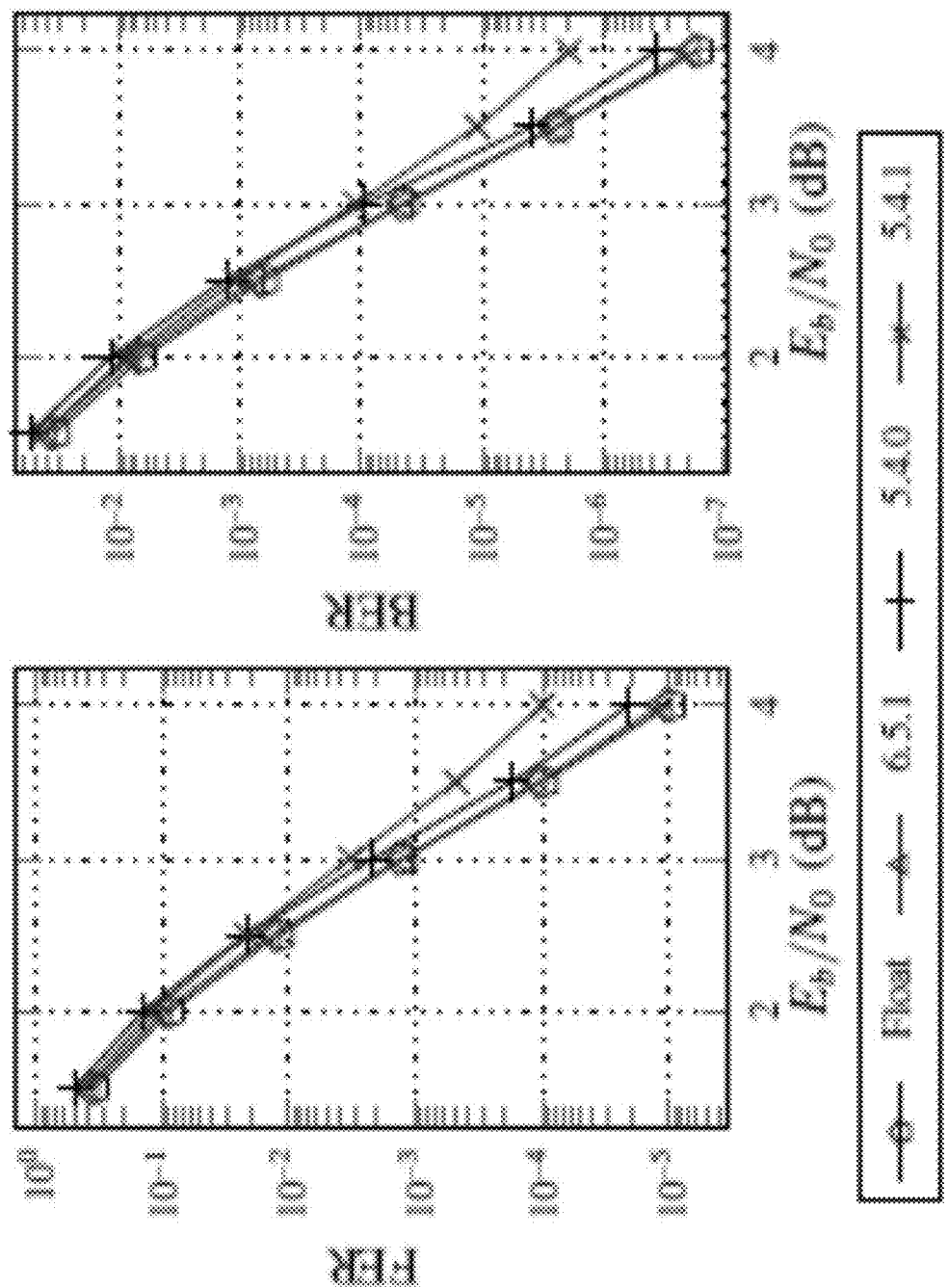
FIG. 7 depicts an example of the effect of quantization on the error-correction performance of a (1024, 512) polar code.

The quantization used was determined by running fixed point simulations with bit-true models of the decoders. A smaller number of bits is used to store the channel LLRs compared to that of the other LLRs used in the decoder. All LLRs use 2's complement representation and share the same number of fractional bits. We denote quantization as $Q_i$, $Q_c$, $Q_f$ where $Q_c$ is the total number of bits to store a channel LLR, $Q_i$ is the total the number of bits used to store internal LLRs and $Q_f$ is the number of fractional bits in both. $Q_i$ and $Q_c$ both include the sign bit. FIG. 7 shows that, for a (1024, 512) polar code modulated with BPSK and transmitted over an AWGN channel, using $Q_i$, $Q_c$, $Q_f$ equal to 5.4.0 results in a 0.1 dB performance degradation at a bit-error rate of $10^{-6}$. Thus that quantization was used for the hardware results.

ASIC synthesis results are for the 65 nm CMOS GP technology from TSMC and are obtained with Cadence RTL Compiler. Unless indicated otherwise, all results are for the worst-case library at a supply voltage of 0.72 V with an operating temperature of 125° C. Power consumption estimations are also obtained from Cadence RTL Compiler, switching activity is derived from simulation vectors. Only registers were used for memory due to the lack of access to an SRAM compiler.

Table I shows the results for various initiation intervals. Besides the effect on throughput, increasing the initiation interval causes a significant reduction in memory requirements without significantly affecting combinational logic. Since area is largely dominated by registers, increasing the initiation interval has great effect on the total area. For example, using I=50 results in an area that is more than 10 times smaller, at the cost of a throughput that is 50 times lower. Table I also shows that reducing the area has a direct effect on the estimated power consumption, which significantly drops as I.

TABLE I

| I | Tot. Area (mm²) | Log. Area (mm²) | Mem. Area (mm²) | T/P (Gbps) | Power (mW) | Energy (pJ/bit) |
|---|---|---|---|---|---|---|
| 1 | 12.369 | 0.60 | 11.75 | 512.0 | 3,830 | 7.5 |
| 4 | 4.921 | 0.64 | 4.24 | 128.0 | 1,060 | 8.3 |
| 50 | 1.232 | 0.65 | 0.56 | 10.2 | 107 | 10.5 |
| 167 | 0.998 | 0.63 | 0.34 | 3.1 | 62 | 20.0 |

Increasing the initiation interval I offers a diminishing return as it gets closer to the maximum, 167 for the example (1024, 512) code. Also, as I is increased, the energy efficiency is reduced.

Tables II and III show the effect of the code length on area, decoding latency, coded throughput, power consumption, and on energy efficiency for polar codes of short to moderate lengths. Table II contains results for the fully-unrolled deeply-pipelined architecture (I=1) and the code rate R is fixed to 1/2 for all polar codes. Table III contains results for the fully-unrolled partially-pipelined architecture where the maximum initiation interval ($I_{max}$) is used and the code rate R is 5/6.

TABLE II

| N | Tot. Area (mm²) | Log. Area (mm²) | Mem. Area (mm²) | Latency (ns) | T/P (Gbps) | Power (mW) | Energy (pJ/bit) |
|---|---|---|---|---|---|---|---|
| 128 | 0.349 | 0.05 | 0.29 | 152 | 64 | 105 | 1.6 |
| 256 | 1.121 | 0.12 | 0.99 | 268 | 128 | 342 | 2.7 |
| 512 | 3.413 | 0.27 | 3.14 | 408 | 256 | 1,050 | 4.0 |
| 1024 | 12.369 | 0.60 | 11.75 | 728 | 512 | 3,830 | 7.5 |
| 2048 | 43.541 | 1.32 | 42.16 | 1,304 | 1,024 | 13,526 | 13.2 |

As shown in Table II, with a deeply-pipelined architecture, logic area usage almost grows as N $\log_2$ N, whereas memory area is closer to being quadratic in code length N. The logic area required for a deeply-pipelined unrolled decoder implemented in 65 nm ASIC technology can be approximated with an accuracy greater than 98% using C·N $\log_2$ N, where the constant C is set to 1/17,000.

Curve fitting shows that the memory area is quadratic with code length N. Let the memory area be defined by $a+bN+cN^2$, setting a=0.249, b=2.466×10⁻³ and c=8.912×10⁻⁶ results in a standard error of 0.1839.

As shown in Table II, throughput exceeding 1 Tbps and 500 Gbps can be achieved with a deeply-pipelined decoder for polar codes of length 2048 and 1024, respectively. As the memory area grows quadratically with the code length, the amount of energy required to decode a bit increases with the code length.

TABLE III

| N | I | Tot. Area (mm²) | Mem. Area (mm²) | Latency (μs) | T/P (Gbps) | Power (mW) | Energy (pJ/bit) |
|---|---|---|---|---|---|---|---|
| 1024 | 206 | 0.793 | 0.28 | 0.646 | 2.5 | 51 | 20.5 |
| 2048 | 338 | 1.763 | 0.61 | 0.888 | 3.0 | 108 | 35.6 |
| 4096 | 665 | 4.248 | 1.44 | 1.732 | 3.1 | 251 | 81.5 |

For a partially-pipelined architecture with $I_{max}$, both the memory and total area scale linearly with N. The power consumption is shown to almost scale linearly as well. The results of Table III also show that it was possible to synthesize ASIC decoders for larger code lengths than what was possible with a deeply-pipelined architecture.

The effect of using different code rates for a polar code of length N=1024 is shown in Table IV. We note that the higher rate codes do not have noticeably lower latency compared to the rate-1/2 code. This is due to limiting the width of SPC nodes to $N_{SPC}$=4. The result is that long SPC codes are implemented as trees whose leftmost child is a width-4 SPC node and the others are all rate-1 nodes. Thus, for each additional stage ($\log_2 N_v - \log_2 N_{SPC}$) of an SPC code of length $N_v > N_{SPC}$, four nodes with a total latency of 3 clock cycles are required: F, G followed by I, and Combine. This brings the total latency of decoding a long SPC code to $3(\log_2 N_v - \log_2 N_{SPC})+1$ clock cycles.

TABLE IV

| R | Tot. Area (mm²) | Mem. Area (mm²) | Latency (CCs) | Latency (ns) | Power (mW) | Energy (pJ/bit) |
|---|---|---|---|---|---|---|
| 1/2 | 12.369 | 11.75 | 364 | 727 | 3,830 | 7.5 |
| 2/3 | 13.049 | 12.45 | 326 | 651 | 4,041 | 6.2 |
| 3/4 | 15.676 | 15.05 | 373 | 745 | 4,865 | 6.5 |
| 5/6 | 14.657 | 14.05 | 323 | 645 | 4,549 | 7.1 |

From Table IV, it can be seen that varying the rate does not affect the logic area that remains almost constant at approximately 0.61 mm². Memory, in the form of registers, dominates the decoder area. Therefore, the estimated power consumption scales according to the memory area.

To decode a frame, an SC decoder needs to load a frame, visit all $\Sigma_{i=1}^{log_2 N} 2^i$ edges of the decoder tree twice and store the estimated code word. A deeply-pipelined SC decoder for a (128, 64) polar code has an area of 2.17 mm², a latency of 510 clock cycles, and a power consumption of 677 mW. These values are 6.2, 6.7, and 6.4 times as much as their counterparts of the deeply-pipelined Fast-SSC decoder reported in Table II.

Figure 8:
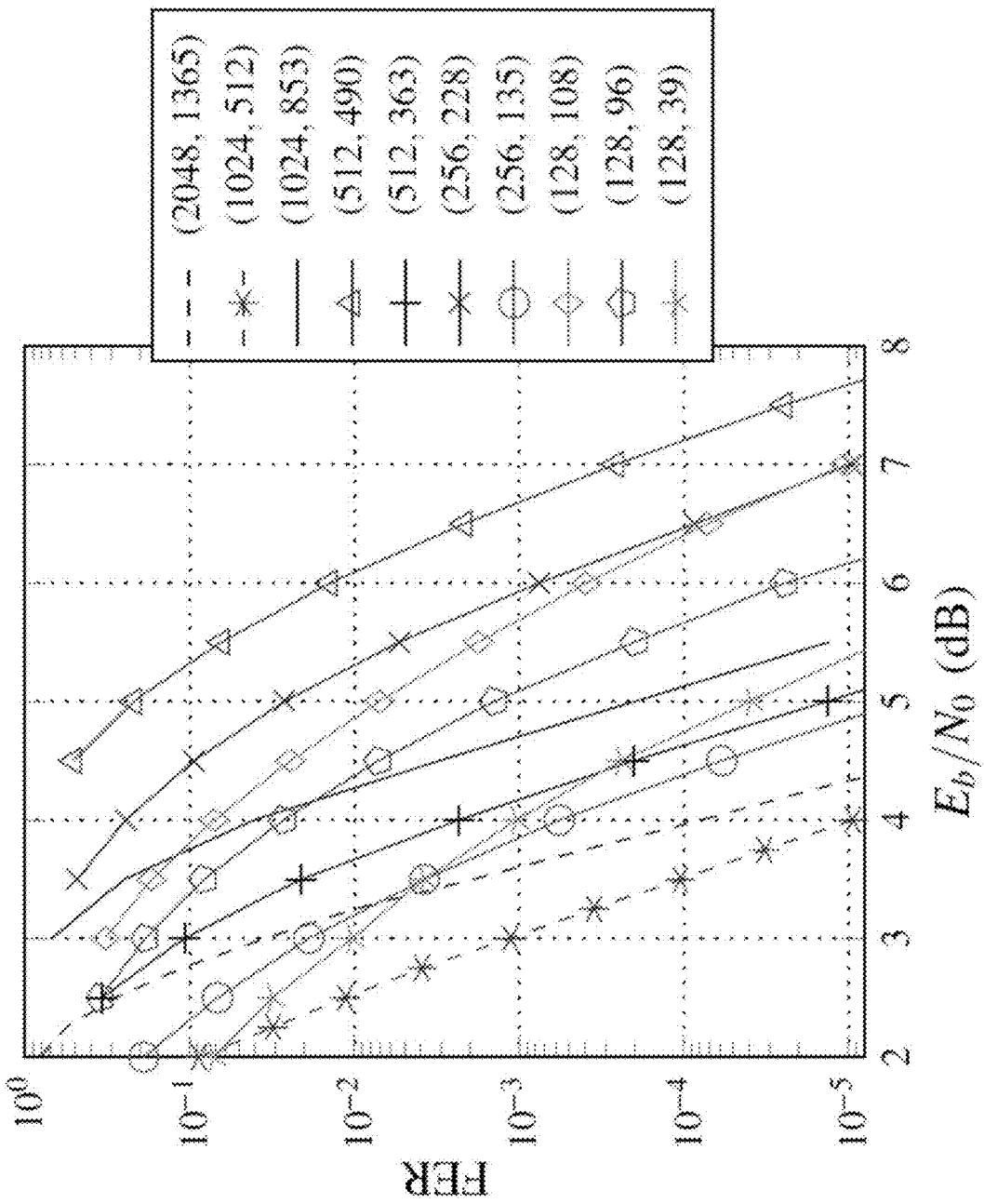
FIG. 8 depicts an example of the error-correction performance of ten different polar codes supported by a decoder with $N_{MAX}=2048$.

FIG. 8 shows the frame-error rate performance of ten different polar codes. The decoder with $N_{MAX}$=2048 supports all ten illustrated polar codes whereas the decoder with $N_{MAX}$=1024 supports all polar codes but the two shown as dotted curves. All simulations were generated using random code words modulated with binary phase-shift keying and transmitted over an additive white Gaussian channel.

It can be seen from FIG. 8 that the error-correction performance of the supported polar codes varies greatly. For codes of the same lengths, the codes with the lowest code rates perform significantly better than their higher rate counterpart. For example, at an FER of 10⁻⁴, the performance of the (512, 363) polar code is almost 3 dB better than that of the (512,490) code.

Table V shows the latency and information throughput for both decoders with $N_{MAX} \in \{1024, 2048\}$. To reduce the area and latency while retaining the same throughput, the initiation interval I can be increased along with the clock frequency.

If both decoders have initiation intervals of 20, Table V assumes clock frequencies of 500 MHz and 250 MHz for the decoders with $M_{max}$=1024 and $N_{max}$=2048, respectively. While their master codes differ, both decoders feature a peak information throughput in the vicinity of 20 Gbps. For the decoder with the smallest $N_{max}$, the seven other polar codes have an information throughput in the multi-gigabit per second range with the exception of the shortest and lowest-rate constituent code. That (128, 39) constituent code still has an information throughput close to 1 Gbps. The decoder with $N_{max}$=2048 offers multi-gigabit throughput for most of the supported polar codes. The minimum information throughput is also with the (128, 39) polar code at approximately 500 Mbps.

TABLE V

| Code (N, k) | Rate (k/N) | Info. T/P (Gbps) $N_{max}=$ 1024 | Info. T/P (Gbps) $N_{max}=$ 2048 | Latency (CCs) $N_{max}=$ 1024 | Latency (CCs) $N_{max}=$ 2048 | Latency (ns) $N_{max}=$ 1024 | Latency (ns) $N_{max}=$ 2048 |
|---|---|---|---|---|---|---|---|
| (2048, 1365) | 2/3 | — | 17.1 | — | 503 | — | 2,012 |
| (1024, 853) | 5/6 | 21.3 | 10.7 | 323 | 236 | 646 | 944 |
| (1024, 512) | 1/2 | — | 6.4 | — | 265 | — | 1,060 |
| (512, 490) | 19/20 | 12.3 | 6.2 | 95 | 75 | 190 | 300 |
| (512, 363) | 7/10 | 9.1 | 4.5 | 226 | 159 | 452 | 636 |
| (256, 228) | 9/10 | 5.7 | 2.6 | 86 | 61 | 172 | 244 |
| (256, 135) | 1/2 | 3.4 | 1.7 | 138 | 96 | 276 | 384 |
| (128, 108) | 5/6 | 2.7 | 1.4 | 54 | 40 | 108 | 160 |
| (128, 96) | 3/4 | 2.4 | 1.2 | 82 | 52 | 164 | 208 |
| (128, 39) | 1/3 | 0.98 | 0.49 | 54 | 42 | 108 | 168 |

In terms of latency, the decoder with $N_{max}$=1024 requires 646 ns to decode its longest supported code. The latency for all the other codes supported by that decoder is under 500 ns. Even with its additional dedicated node and relaxed maximum size constraint on the Repetition and SPC nodes, the decoder with $N_{max}$=2048 has greater latency overall because of its lower clock frequency. For example, its latency is of 2.01 us, 944 ns and 1.06 us for the (2048, 1365), (1024, 853) and (1024, 512) polar codes, respectively.

Using the same nodes and constraints as for $N_{max}$=1024, the $N_{max}$=2048 decoder would allow for greater clock frequencies. While 689 clocks cycles would be required to decode the longest polar code instead of 503, a clock of 500 MHz would be achievable, effectively reducing the latency from 2.01 µs to 1.38 µs and doubling the throughput. However, this reduction comes at the cost of much greater area and an estimated power consumption close to 1 W.

Table VI shows the synthesis results along with power consumption estimations for the two implementations of the multi-mode unrolled decoder. The first two columns are for the decoder with $N_{max}$=1024, based on the (1024, 853) master code. It was synthesized for clock frequencies of 500 MHz and 650 MHz, respectively, with initiation intervals I of 20 and 26. The third and fourth columns are for the decoders with $N_{max}$=2048, built from the assembled (2048, 1365) polar code. These decoders have an initiation interval I of 20 or 28, with lower clock frequencies of 250 MHz and 350 MHz, respectively. For comparison with the prior art, the same table also includes results for a dedicated partially-pipelined decoder for a (1024, 512) polar code.

TABLE VI

|  | Multi-mode | | | | Dedicated |
|---|---|---|---|---|---|
| Algorithm | Fast-SSC | | | | Fast-SSC |
| Technology | 65 nm | | | | 65 nm |
| $N_{max}$ | 1024 | | 2048 | | 1024 |
| Code | (1024, 853) | | (2048, 1365) | | (1024, 512) |
| Init. Interval (I) | 20 | 26 | 20 | 28 | 20 |
| Supply (V) | 0.72 | 1.0 | 0.72 | 1.0 | 1.0 |
| Oper. temp. (° C.) | 125 | 25 | 125 | 25 | 25 |
| Area (mm$^2$) | 1.71 | 1.44 | 4.29 | 3.58 | 1.68 |
| Area @65 nm (mm$^2$) | 1.71 | 1.44 | 4.29 | 3.58 | 1.68 |
| Frequency (MHz) | 500 | 650 | 250 | 350 | 500 |
| Latency (µs) | 0.65 | 0.50 | 2.01 | 1.44 | 0.73 |
| Coded T/P (Gbps) | 25.6 | 25.6 | 25.6 | 25.6 | 25.6 |
| Sust. Coded T/P (Gbps) | 25.6 | 25.6 | 25.6 | 25.6 | 25.6 |
| Area Eff. (Gbps/mm$^2$) | 15.42 | 17.75 | 5.97 | 7.16 | 15.27 |
| Power (mW) | 226 | 546 | 379 | 740 | 386 |
| Energy (pJ/bit) | 8.8 | 27.3 | 14.8 | 28.9 | 15.1 |

For consistency, only the largest polar code supported by each of the multi-mode unrolled decoders is used. While the area of the decoder with $N_{MAX}$=2048 is over twice that of the one with $N_{MAX}$=1024, the master code has twice the length and that decoder implementation supports two more modes. Both of the multi-mode decoders have a coded throughput that is an order of magnitude greater than the dedicated decoder.

Implementation of the embodiments described above may be done in various ways. For example, the techniques, blocks, steps and means may be implemented in hardware, software, or a combination thereof. For a hardware implementation, the processing elements may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above and/or a combination thereof.

Furthermore, embodiments may be implemented by hardware, software, scripting languages, firmware, middleware, microcode, hardware description languages and/or any combination thereof. When implemented in software, firmware, middleware, scripting language and/or microcode, the program code or code segments to perform the necessary tasks may be stored in a machine readable medium, such as a storage medium. A code segment or machine-executable instruction may represent a procedure, a function, a subprogram, a program, a routine, a subroutine, a module, a software package, a script, a class, or any combination of instructions, data structures and/or program statements. A code segment may be coupled to another code segment or a hardware circuit by passing and/or receiving information, data, arguments, parameters and/or memory content. Information, arguments, parameters, data, etc. may be passed, forwarded, or transmitted via any suitable means including memory sharing, message passing, token passing, network transmission, etc.

For a firmware and/or software implementation, the methodologies may be implemented with modules (e.g., procedures, functions, and so on) that perform the functions described herein. Any machine-readable medium tangibly embodying instructions may be used in implementing the methodologies described herein.

The above description is meant to be exemplary only, and one skilled in the relevant arts will recognize that changes may be made to the embodiments described without departing from the scope of the invention disclosed. For example, the blocks and/or operations in the flowcharts and drawings described herein are for purposes of example only. There may be many variations to these blocks and/or operations without departing from the teachings of the present disclosure. For instance, the blocks may be performed in a differing order, or blocks may be added, deleted, or modified. The structure illustrated is thus provided for efficiency of teaching. The present disclosure may be embodied in other specific forms without departing from the subject matter of the claims. Also, one skilled in the relevant arts will appreciate that while the systems, methods and computer readable mediums disclosed and shown herein may comprise a specific number of elements/components, the systems, methods and computer readable mediums may be modified to include additional or fewer of such elements/components. The present disclosure is also intended to cover and embrace all suitable changes in technology. Modifications which fall within the scope of the present invention will be apparent to those skilled in the art, in light of a review of this disclosure, and such modifications are intended to fall within the appended claims.

The invention claimed is:

1. A decoder for polar encoded code words comprising:
   a master code input configured for receiving a polar encoded master code of length N carrying k information bits and N−k frozen bits;
   at least one constituent code input configured for receiving a polar encoded constituent code of length N/p carrying j information bits and N/p−j frozen bits, where p is a power of 2;
   decoding resources for decoding the master code, the decoding resources comprising processing elements and memory elements connected in an unrolled architecture and defining an operation path between the master code input and an output; and at least one input multiplexer provided in the operation path for selectively transmitting N/p bits of one of the master code and the constituent code to a subset of the decoding resources.

2. The decoder of claim 1, wherein the subset of the decoding resources output an estimated code word corresponding to the N/p bits of one of the master code and the constituent code, and further comprising at least one output multiplexer provided in the operation path downstream from the at least one input multiplexer for selectively transmitting the estimated code word towards the output.

3. The decoder of claim 1, wherein the master code is composed of q constituent codes, and the at least one input multiplexer comprises m input multiplexers, where m<q.

4. The decoder of claim 3, wherein the subset of the decoding resources output an estimated code word corresponding to the N/p bits of one of the master code and at least one of the q constituent codes, and further comprising s output multiplexers provided in the operation path downstream from the m input multiplexers for selectively transmitting the estimated code word towards the output.

5. The decoder of claim 4, wherein s<m.

6. The decoder of claim 1, further comprising a controller configured for generating multiplexer select signals to route the master code or the constituent code through the decoder.

7. The decoder of claim 1, wherein the unrolled architecture is partially pipelined.

8. The decoder of claim 1, wherein the decoder is configured for applying successive-cancellation decoding to the master code and the constituent code.

9. The decoder of claim 1, wherein the decoder is configured for applying list-based decoding to the master code and the constituent code.

10. A method for decoding polar encoded codes using an unrolled polar code decoder, the method comprising:
  receiving, at a first intermediate node of an operation path defined between an input and an output of an unrolled decoder formed of decoding resources for decoding a master code of length N and a first polar encoded constituent code of length N/p, where p is a power of 2;
  transmitting the first polar encoded constituent code to a first subset of the decoding resources though a first input multiplexer;
  estimating a first code word for the first polar encoded constituent code through the first subset of decoding resources; and
  outputting, at the output, the estimated first code word corresponding to the first polar encoded constituent code.

11. The method of claim 10, further comprising transmitting the estimated first code word towards the output through an output multiplexer.

12. The method of claim 10, further comprising:
  receiving, at a second intermediate node of the operation path, a second polar encoded constituent code of length N/p, where p is a power of 2;
  transmitting the second polar encoded constituent code to a second subset of the decoding resources though a second input multiplexer;
  estimating a second code word for the second polar encoded constituent code through the second subset of decoding resources; and
  outputting, at the output, the estimated second code word corresponding to the second polar encoded constituent code.

13. The method of claim 12, wherein the first polar encoded constituent code and the second polar encoded constituent code are of different lengths.

14. The method of claim 12, wherein the second subset of decoding resources is a subset of the first subset of decoding resources.

15. The method of claim 12, further comprising transmitting the estimated first code word and the estimated second code word towards the output through at least one output multiplexer.

16. The method of claim 15, wherein the first polar encoded constituent code and the second polar encoded constituent code are of a same length, and wherein the estimated first code word and the estimated second code word are transmitted towards the output through a same one of the at least one output multiplexer.

17. The method of claim 12, wherein the first polar encoded constituent code and the second polar encoded constituent code are sibling constituent codes that share a parent node in a decoder tree.

* * * * *